United States Patent
Chen et al.

(10) Patent No.: US 11,121,065 B2
(45) Date of Patent: Sep. 14, 2021

(54) SEMICONDUCTOR PACKAGING STRUCTURE WITH ANTENNA ASSEMBLY

(71) Applicant: SJ Semiconductor (Jiangyin) Corporation, Jiangyin (CN)

(72) Inventors: Yenheng Chen, Jiangyin (CN); Chentar Wu, Jiangyin (CN); Chengchung Lin, Jiangyin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 172 days.

(21) Appl. No.: 16/232,988

(22) Filed: Dec. 26, 2018

(65) Prior Publication Data

US 2019/0198434 A1 Jun. 27, 2019

(30) Foreign Application Priority Data

Dec. 27, 2017 (CN) .......................... 201721855101.2

(51) Int. Cl.
| H01L 23/498 | (2006.01) |
| H01L 23/15 | (2006.01) |
| H01L 23/31 | (2006.01) |
| H01L 23/66 | (2006.01) |

(52) U.S. Cl.
CPC ........ *H01L 23/49822* (2013.01); *H01L 23/15* (2013.01); *H01L 23/3128* (2013.01); *H01L 23/3192* (2013.01); *H01L 23/49816* (2013.01); *H01L 23/49827* (2013.01); *H01L 23/66* (2013.01); *H01L 2223/6677* (2013.01); *H01L 2224/11* (2013.01)

(58) Field of Classification Search
None
See application file for complete search history.

(56) References Cited

U.S. PATENT DOCUMENTS

| 2009/0146281 A1* | 6/2009 | Jung ........................ H01L 24/97 257/678 |
| 2014/0225276 A1* | 8/2014 | Ho ...................... H01L 29/0657 257/774 |
| 2017/0048981 A1* | 2/2017 | Hu ........................ H01L 25/117 |
| 2019/0198972 A1* | 6/2019 | Chen ................. H01L 23/49822 |

* cited by examiner

*Primary Examiner* — Alexander G Ghyka
(74) *Attorney, Agent, or Firm* — Alston & Bird LLP

(57) ABSTRACT

The present application provides a semiconductor packaging structure with an antenna assembly, including: a substrate with through-substrate-via holes; a rewiring layer, located on the substrate; metal bumps, located on and electrically connected to the rewiring layer; a semiconductor chip, located on a surface of the rewiring layer and electrically connected to the rewiring layer; a conductive column, filling in the via hole; a bottom filling layer filling up a gap between the semiconductor chip and the rewiring layer; a polymer layer surrounding the metal bumps and the semiconductor chip; and an antenna assembly, which is electrically connected to one metal bump through the conductive column and the rewiring layer. By using the foregoing solution, the rewiring layer and the metal bumps facilitate proper packaging design.

13 Claims, 4 Drawing Sheets

SEMICONDUCTOR PACKAGING STRUCTURE WITH ANTENNA ASSEMBLY

CROSS REFERENCES TO RELATED APPLICATIONS

This application claims the benefits of priority to Chinese Patent Application No. CN2017218551012, entitled "Semiconductor Packaging Structure with Antenna Assembly", filed with SIPO on Dec. 27, 2017, the contents of which are incorporated herein by reference in its entirety.

TECHNICAL FIELD

The present application relates to the technical field of semiconductor packaging, and in particular to a semiconductor packaging structure with an antenna assembly.

BACKGROUND

As integrated circuits possess increasingly stronger functions, better performance and higher integration levels, innovative integrated circuits have been developed, and packaging starts to play more important roles in integrated circuit products, accounting for an increasingly larger proportion in the value of the entire electronic systems. Moreover, as the feature sizes of the integrated circuits reach a nanometer level, the transistors are made with higher densities and higher clock frequencies. So packaging is developed in a direction of a higher density.

Because fan-out wafer-level packaging (FOWLP) technology has advantages such as miniaturization, low cost and high integration level, better performance and higher energy efficiency, FOWLP has become an important packaging method for IC devices meeting high requirements. For example, in a mobile/wireless network, the FOWLP technology is one of the packaging technologies that currently has shown best development prospects. In addition, digital communication prefers a radio frequency chip provided with an antenna during use. However, for an existing radio frequency antenna, when performing layout design on a radio frequency function module, a developer directly lays out the antenna on a printed circuit board (PCB) or leaves extra room for an interface of an external antenna. For most of the existing radio frequency antennas, the antenna is directly laid out on the PCB. However, an antenna needs to occupy a PCB area. Consequently, PCB area and an area of an entire packaging structure become larger. Moreover, for fan-out wafer-level packaging using plastics for packaging, it is difficult to avoid aspects such as chip warpage. Moreover, in a packaging process, it is also difficult to control problems such as gliding and misalignment caused by expansion and contraction of a material. Overheating also happen from poor heat conductivity. More problems occur from fabrication process and material selection resulting in less-than-expected lifetime of bonding strength between components. Products will lose protection from external water vapor.

Therefore, a bonding technique to build a semiconductor packaging structure with an antenna assembly is needed to resolve the chip warpage and overheat problems at a low cost.

SUMMARY

The present application provides a semiconductor packaging structure with an antenna assembly, including: a substrate having a first surface and a second surface opposite to the first surface, at least one via hole through the first surface and the second surface is formed in the substrate; a rewiring layer located on the first surface of the substrate; a plurality of metal bumps, located on a surface of the rewiring layer and electrically connected to the rewiring layer; a semiconductor chip, located on the surface of the rewiring layer and electrically connected to the rewiring layer, a space is configured between the semiconductor chip and each of the plurality of metal bumps; a conductive column, filling in the at least one via hole; a bottom filling layer, filling up a gap between the semiconductor chip and the rewiring layer; a polymer layer, located on the surface of the rewiring layer, surrounding the plurality of metal bumps, the bottom filling layer and the semiconductor chip, but exposing a top part of each of the plurality of metal bumps and a top part of the semiconductor chip; and an antenna assembly, located on the second surface of the substrate, the antenna assembly is electrically connected to at least one of the plurality of metal bumps through the conductive column and the rewiring layer.

DESCRIPTION OF COMPONENT MARK NUMBERS

Figure 1:
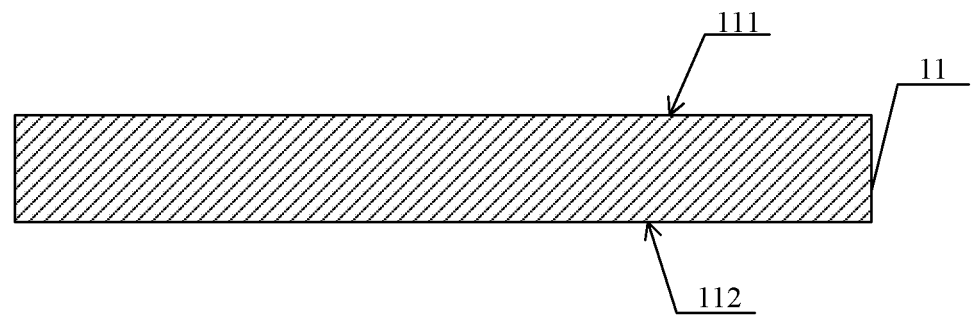
FIG. 1 shows a substrate.

11 Substrate
111 First surface
112 Second surface
21 Rewiring layer
211 Under-bump metal layer
212 Dielectric layer
213 Metal wire layer
31 Metal bump
41 Semiconductor chip
51 Bottom filling layer 52 Polymer layer
61 Via hole
71 Conductive column
81 Antenna unit
811 Central portion
812 Peripheral portion
91 Bonding layer
92 Fixed ring

DETAILED DESCRIPTION OF THE PREFERRED EMBODIMENTS

The implementation mode of the present invention will be described below through specific embodiments. One skilled in the art can easily understand other advantages and effects of the present invention according to contents disclosed by the specification.

It should be known that, structures, proportions, sizes and the like drawn in drawings appended to this specification are all only used to be understood and read by a person skilled in the art in cooperation with content disclosed in the specification, but are not used to limit limitation conditions that the present application may implement, and therefore do not have a technically essential meaning. Any modification in a structure, change in a proportion relationship or adjustment in a size, without affecting the efficacy that the present application can generate and the object that the present application can achieve, should still fall within the scope that the technical content disclosed in the present application can cover. Moreover, terms such as "upper", "lower", "left", "right", "middle" and "a" cited in this specification are also only used to facilitate clear description, but are not used to limit the scope that the present application may implement, and change or adjustment in a relative relationship between the terms, without essentially changing the technical content, should also be considered as the scope that the present application may implement.

As shown in FIGS. 1-11, the present application provides a semiconductor packaging structure with an antenna assembly, which includes: a substrate 11 having a first surface 111 and a second surface 112 opposite to the first surface, at least one via hole 61 through the first surface and the second surface is formed in the substrate 11; a rewiring layer 21 located on the first surface 111 of the substrate; a plurality of metal bumps 31, located on a surface of the rewiring layer 21 11 and electrically connected to the rewiring layer 21; a semiconductor chip 41, located on the surface of the rewiring layer 21 and electrically connected to the rewiring layer 21, a space is configured between the semiconductor chip 41 and the metal bump 31; a conductive column 71, filling in the via hole 61, and running through the substrate 11 vertically; a bottom filling layer 51, filling up a gap between the semiconductor chip 41 and the rewiring layer 21; a polymer layer 52, located on the surface of the rewiring layer 21, surrounding the metal bump 31, the bottom filling layer 51 and the semiconductor chip 41, but exposing a top part of the metal bump 31 and a top part of the semiconductor chip 41; and an antenna assembly, located on the second surface 112 of the substrate, the antenna assembly is electrically connected to the metal bump 31 through the conductive column 71 and the rewiring layer 21.

In an example, the substrate 11 includes a quartz glass substrate or a sapphire substrate.

Specifically, the present application provides a semiconductor packaging structure, the substrate 11 is preferably a quartz substrate or a sapphire substrate. On one hand, because the quartz plate does not have warpage problem, the semiconductor chip may be prevented from problems such as fracture, warpage and breaking in a subsequent fabrication process; and on the other hand, heat conduction of quartz is better than that of MC by nearly ten times to hundred times, and quartz has good heat conductivity, thereby resolving a heat effect problem in a packaging process. Additionally, in other examples, other glass substrates may be further selected as the substrate, which is not specifically limited herein.

Additionally, the shape of the substrate 11 may be set according to actual needs, the shape of the substrate 11 may be a rectangle, a circle, a hexagon, a triangle, a trapezoid or the like, and is not limited herein. The via hole 61 is further formed in the substrate 11. In an example, the via hole 61 may be formed in the substrate by using a laser drilling process, or the via hole 61 may be formed in the substrate 11 by using a process such as litho-etching, and a cross-sectional view of the via hole 61 may be set according to actual needs. Preferably, in this embodiment, the cross-sectional shape of the via hole 61 may be an inverted trapezoid. Certainly, in other examples, the shape of the via hole 61 may further have a rectangle shape.

It should be noted that, when a metal wire layer 213 that is in the rewiring layer 21 and that corresponds to a location of the via hole 61 is not exposed on a surface of a dielectric layer, after running through the substrate 11, the via hole 61 further needs to extend into the dielectric layer 212 of the rewiring layer 21, so as to ensure that a part of the metal wire layer 213 may be exposed from the via hole 61.

Specifically, the semiconductor chip 41 may be any semiconductor function chip, and a connection bonding pad electrically leading out a function device inside the semiconductor chip 41 is further formed on a front surface of the semiconductor chip 41. The connection bonding pad is exposed on the front surface of the semiconductor chip. Preferably, the top surface of the connection bonding pad is leveled with the top surface of the semiconductor chip. That a space is configured between the semiconductor chip 41 and the metal bump 31 means that, at a location that is on a surface of the rewiring layer and that protrudes from the rewiring layer, a space is configured between the semiconductor chip and the metal bump, that is, the exposed outside is not conductive.

Additionally, in the present application, structures such as the antenna assembly, the rewiring layer, the metal bump and the semiconductor chip are disposed on two opposite side surfaces of the substrate. Therefore, an antenna structure may be properly designed, and reduction in the volume of the entire semiconductor packaging structure may be facilitated.

In an example, the semiconductor packaging structure further includes a bottom filling layer 51, and the bottom filling layer 51 fills up a gap between the semiconductor chip and the rewiring layer.

Specifically, the bottom filling layer 51 fills between the semiconductor chip 41 and the rewiring layer 21 adjacent to the semiconductor chip 41, and covers a surface of the semiconductor chip 41. Preferably, the bottom filling layer 51 exceeds a surface of the semiconductor chip and extends to a location around the metal bump on two sides of the semiconductor chip, a material of the filling layer 51 includes a filling adhesive, and the filling layer 51 may protect an adhesion force and stability of the semiconductor chip in a technical process, and may further alleviate a stress concentration problem occurring at an edge and a vertex angle of the semiconductor chip, to avoid fracture and the like of the semiconductor chip, thereby improving packaging reliability.

In an example, the polymer layer 52 includes any one of a polyimide layer, a silica gel layer and an epoxy resin layer.

Specifically, the semiconductor packaging structure provided in the present application further includes the polymer layer 52. The polymer layer 52 fills between the semiconductor chip 41, the bottom filling layer 51 and the metal bump 31. The bottom surface of the semiconductor chip 41 is in contact with the bottom filling layer 51, a side surface of the bottom filling layer 51 in contact with the semiconductor chip 41 is larger than the surface of the semiconductor chip, and the polymer layer 52 fills around the semiconductor chip 41 and the bottom filling layer 51. That is, side walls of the semiconductor chip and the bottom filling layer are covered by the polymer layer, and the polymer layer 52 surrounds the metal bump 31. The polymer layer 52 may play a role of protecting the metal bump and the semiconductor chip, may increase a bonding strength between the metal bump and the rewiring layer 21, and also increases a bonding strength between the semiconductor chip and the bottom filling layer, to prevent the semiconductor chip from wobbling or dropping off. On the other hand, the polymer layer 52 may further prevent impact from oxidation and water vapor on the metal bump, the rewiring layer under the metal bump, and the like. Additionally, the polymer layer may further alleviate a stress at a vertex angle of the semiconductor chip. The polymer layer may be manufactured by using one of compression molding, transfer molding, liquid seal molding, vacuum lamination and spin-coating.

In an example, a structure of the rewiring layer 21 specifically includes: a dielectric layer 212, bonded on the first surface 111 of the substrate 11; one metal wire layer 213, located inside the dielectric layer 212; and an under-bump metal layer 211, located on a surface of the dielectric layer 212, and extending into the dielectric layer 212 to be electrically connected to the metal wire layer 213, the metal bump 31 is disposed on the under-bump metal layer 211.

Specifically, in an example, the rewiring layer 21 includes a metal wire layer 213, a dielectric layer 212 and an under-bump metal layer 211. In an example, a process for manufacturing the under-bump metal layer includes: first forming a metal wire layer on a surface of the substrate, and then forming a dielectric layer on the surface, the dielectric layer encloses the metal wires, in addition, a dielectric layer may alternatively be the first formed, and then processes such as patterning and filling are performed to form an opening in the dielectric layer, thereby fabricating the under-bump metal layer. Certainly, the rewiring layer may be any rewiring layer structure frequently used, or any rewiring layer that may implement an electrical connection leading-out function may be fabricated by using other processes.

Additionally, in other examples, there may alternatively be two or more dielectric layers and two or more metal wire layers. For example, a first insulation layer is formed on a surface of the substrate; the metal wire layer is formed on a surface of the first insulation layer; a second insulation layer is formed on the top surface of the first insulation layer, and the second insulation layer covers the metal wire layer; an opening is formed in the second insulation layer, and the metal wire layer is exposed from the opening; and the under-bump metal layer is formed in the opening.

Specifically, a material of the metal wire layer 213 may be, but is not limited to, a material of copper, aluminum, nickel, gold, silver or titanium, or the metal wire layer 213 may be, but is not limited to, a laminated material layer having two of the foregoing materials. A material of the dielectric layer 212 may be a low-k dielectric material, and may specifically include any one of epoxy resin, silica gel, polyimide (PI), polybenzoxazole (PBO), benzocyclobutene (BCB), silicon oxide, phosphosilicate glass and fluorine-containing glass.

In an example, a structure of the metal bump 31 includes: a copper column, a nickel layer located on the top surface of the copper column and a solder bump located on the nickel layer.

Specifically, the metal bump 31 may be a metal column, a solder ball, a combination of a copper column and solder metal, or the like. In this embodiment, a metal bump 31 is provided, and the fabrication includes: manufacturing an under-bump metal layer on the rewiring layer; forming a copper column on a surface of the under-bump metal layer; forming a metal blocking layer on a surface of the copper column; and forming solder metal on a surface of the metal blocking layer, and forming a solder bump on the surface of the metal blocking layer by using a high-temperature reflow process.

The metal blocking layer includes a nickel layer, and a material of the solder bump includes one of lead, tin and silver, or an alloy containing any of the foregoing solder metal.

In an example, the antenna assembly includes a plurality of antenna units 81, the antenna units 81 have a same shape, and each of the antenna units 81 is disposed with a space from adjacent antenna units 81.

Specifically, the semiconductor packaging structure further includes an antenna assembly, the antenna assembly is electrically connected to the rewiring layer on another surface of the substrate by using the conductive column, and then other electrical connection functions are further performed, a process for forming the antenna assembly may be any process well known by a person of ordinary skill in the art. For example, a dielectric layer of an antenna pattern having a window is first formed, at least the conductive column is exposed from the window pattern, then sputtering, electroplating and the like are performed to form a final antenna.

Specifically, the antenna assembly includes at least one antenna unit 81, and the antenna unit may have a shape of a block or a spiral. Certainly, there may alternatively be a plurality of antenna units 81, such as 10 to 100 antenna units 81, depending on actual needs. When there are two or more antenna units, shapes of different antenna units 81 may be same or different, depending on actual needs. Additionally, when the antenna unit 81 is a block antenna, the block antenna may be a metal block; and when the antenna unit 81 is a spiral antenna, the spiral antenna may be formed by winding a metal wire into a spiral shape. Preferably, profiles of the antenna units are the same. Therefore, even control may be implemented, and it is convenient to perform proper layout according to actual needs.

Additionally, a material of the antenna unit includes, but is not limited to, any of copper, aluminum, nickel, gold, silver, tin and titanium, or the antenna unit has a laminated material layer formed by two or more of the foregoing material layers, and the laminated material layer may be fabricated by using any of a physical vapor deposition process (PVD), a chemical vapor deposition process (CVD), sputtering, electroplating and chemical plating. Additionally, a material of the conductive column 71 is preferably the same as a material of the antenna assembly.

Specifically, the first surface of the substrate 11 may be spin-coated with a conductive adhesive by using a conductive adhesive printing process, so that the conductive adhesive enters the via hole 61 to form the conductive column 71. Certainly, in another example, a conductive material (for example, metal, metal compound and the like) may alternatively be deposited in the via hole 61 by using a process such as a physical vapor deposition process, a chemical vapor deposition process (CVD), or plasma-enhanced CVD to form the conductive column 71. Preferably, the top surface of the conductive column 71 is leveled with the first surface of the substrate 11.

In an example, the antenna unit 81 includes a central portion 811 and a peripheral portion 812 surrounding the central portion 811, and a space is configured between the peripheral portion 812 and the central portion 811, the central portion 811 is electrically connected to the metal bump 31 sequentially through the conductive column 71 and the rewiring layer 21.

In an example, the shape of an outer edge of the central portion 811 includes a circle, the shape of an outer edge of the peripheral portion 812 includes a square, and the shape of an edge of the peripheral portion 812 close to a side of the central portion 811 includes a circle.

Specifically, in this example, each of the antenna units forms a planar inverted F-shaped antenna structure (PIFA). The antenna unit 81 is formed by two parts, comprising a central portion and a peripheral portion surrounding the central portion. Wherein the central portion 811 is directly electrically connected to the conductive column 71, and the space between the peripheral portion 812 and the central portion 811 is shown as D in FIG. 9, the space may range from 10 to 200 μm or be in another range, and is preferably 80 to 150 μm in this example, so as to form an optimal configuration. Additionally, two antenna units 81 are preferably disposed around the semiconductor chip.

In an example, the antenna units 81 are arranged on the second surface 112 of the substrate 11 in an array, or in a loop, the antenna units 81 may also be arranged irregularly on the second surface 112 of the substrate 11.

Specifically, the antenna units are evenly arranged, and a gap exists between the antenna units 81. This design manner is simple in process, other additional processes do not need to be performed on the antenna units having a same profile, and the antenna units are suitable for mass production. Moreover, antenna signals are even, and losses are relatively small. Additionally, a gap between adjacent antenna units is set according to an actual situation. For example, in a plane where a surface of the substrate is placed, along a longitudinal direction or a transverse direction perpendicular to the longitudinal direction, a distance between centers of adjacent antenna units may be set at will, and sizes of the antenna units may also be selected at will. Certainly, an arrangement manner of the antenna units may be set at will according to actual needs, antenna units having a relatively large density may be set at required locations, or the antenna units may be arranged irregularly, which is not specifically limited herein.

In an example, the antenna assembly includes at least two layers of antenna assembly units, and each layer of the antenna assembly units includes at least one antenna unit 81.

Specifically, the antenna assembly may be formed through single-layered arrangement or multi-layered arrangement of a plurality of antenna units 81 on the second surface 112 of the substrate 11, the multi-layered arrangement includes two or more antenna unit layers, and then design of antenna units having a proper quantity and a proper shape is performed on each of the antenna unit layers, two adjacent antenna unit layers are separated by the dielectric layer, and a conductive plug formed in the dielectric layer implements electrical connection between different layers. Therefore, flexible antenna layout design may be performed according to specific needs.

Figure 2:
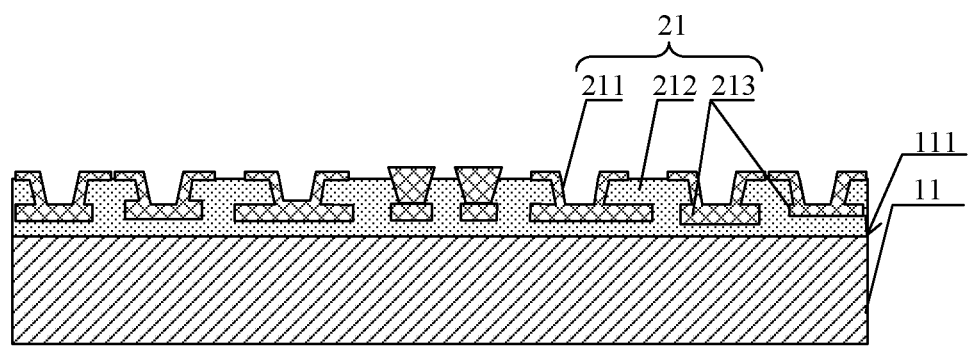
FIG. 2 shows a rewiring layer formed on the substrate consistent with the present application.
Figure 3:
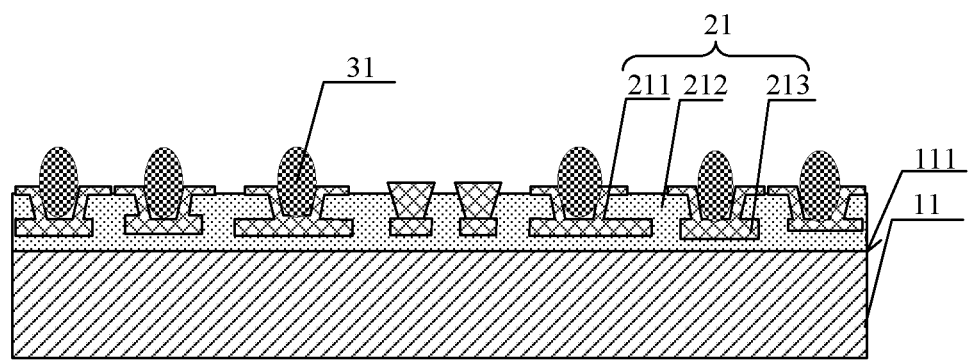
FIG. 3 shows the cross sectional view of the packaging structure after the step of forming metal bumps consistent with the present application.
Figure 4:
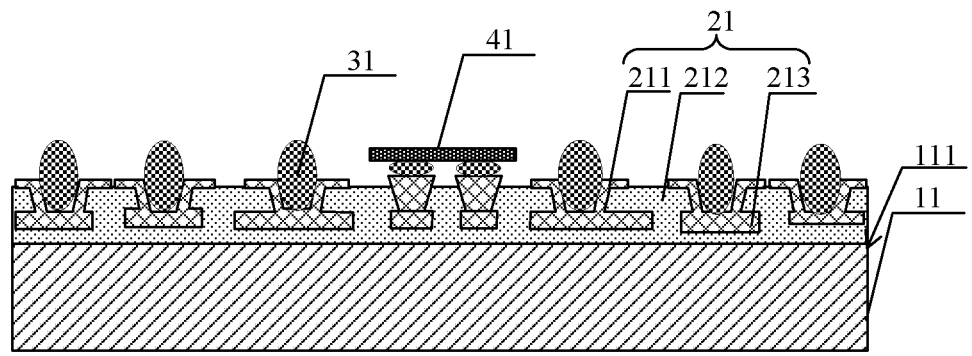
FIG. 4 shows the cross sectional view of the packaging structure after the step of placing a semiconductor chip consistent with the present application.
Figure 5:
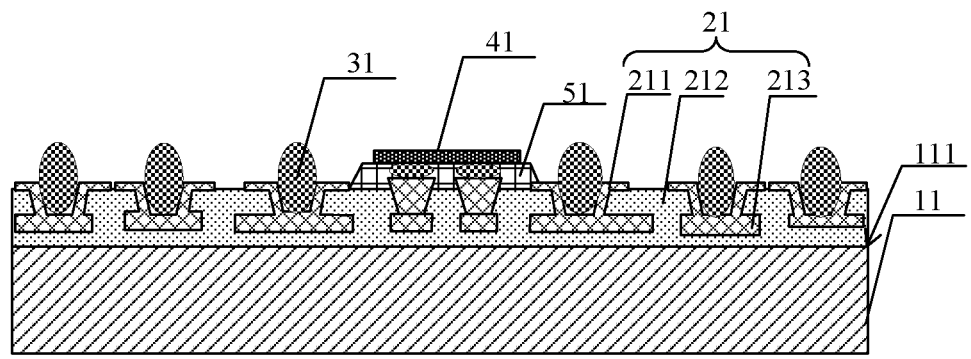
FIG. 5 shows the cross sectional view of the packaging structure after the step of placing a bottom filling layer during fabrication of the semiconductor packaging structure consistent with the present application.
Figure 6:
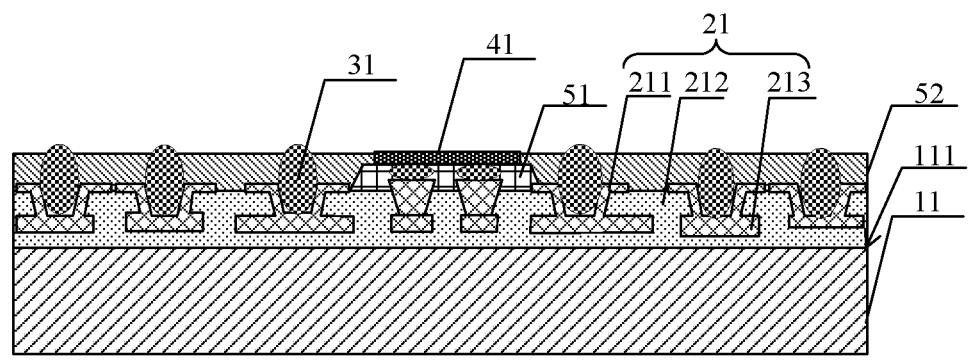
FIG. 6 shows the cross sectional view of the packaging structure after the step of forming a polymer layer consistent with the present application.
Figure 7:
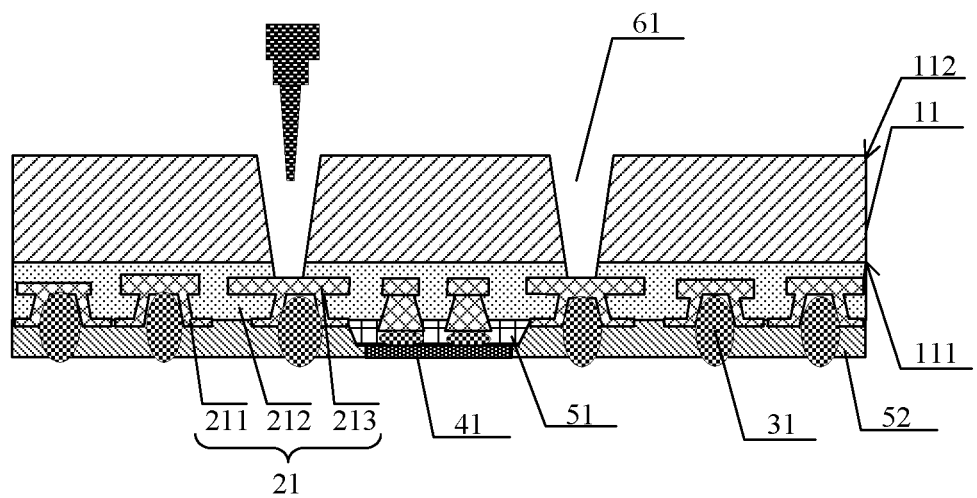
FIG. 7 shows the cross sectional view of the packaging structure after the step of forming vias according to the present application.
Figure 8:
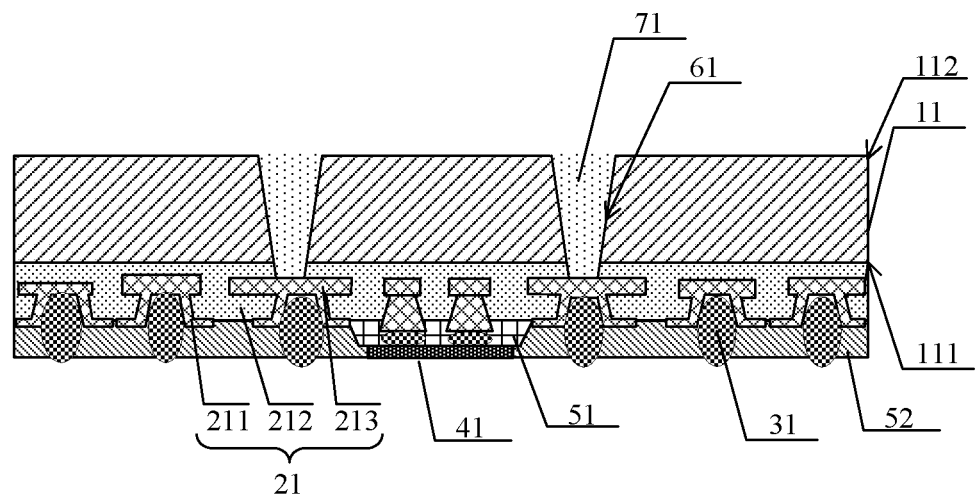
FIG. 8 shows the cross sectional view of the packaging structure after the step of forming a conductive column according to the present application.
Figure 9:
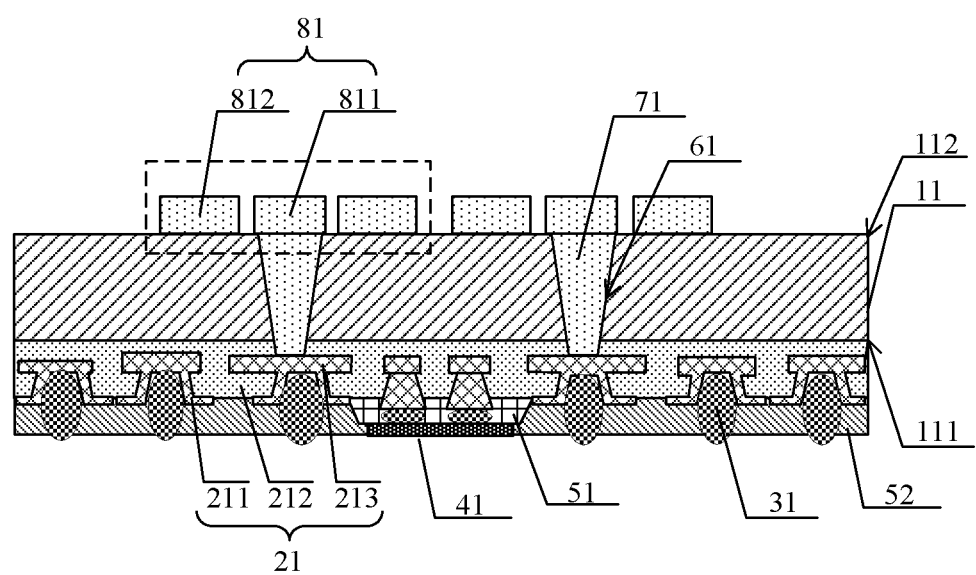
FIG. 9 shows the cross sectional view of the packaging structure after the step of forming an antenna assembly according to the present application.
Figure 10:
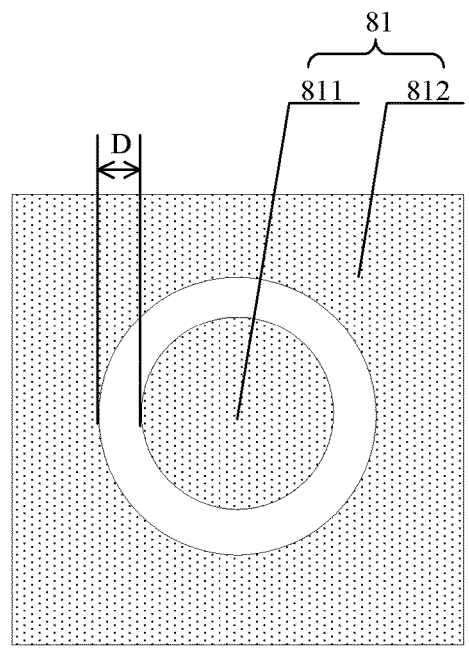
FIG. 10 shows the top view of the antenna assembly taken from the dashed-line box in FIG. 9.
Figure 11:
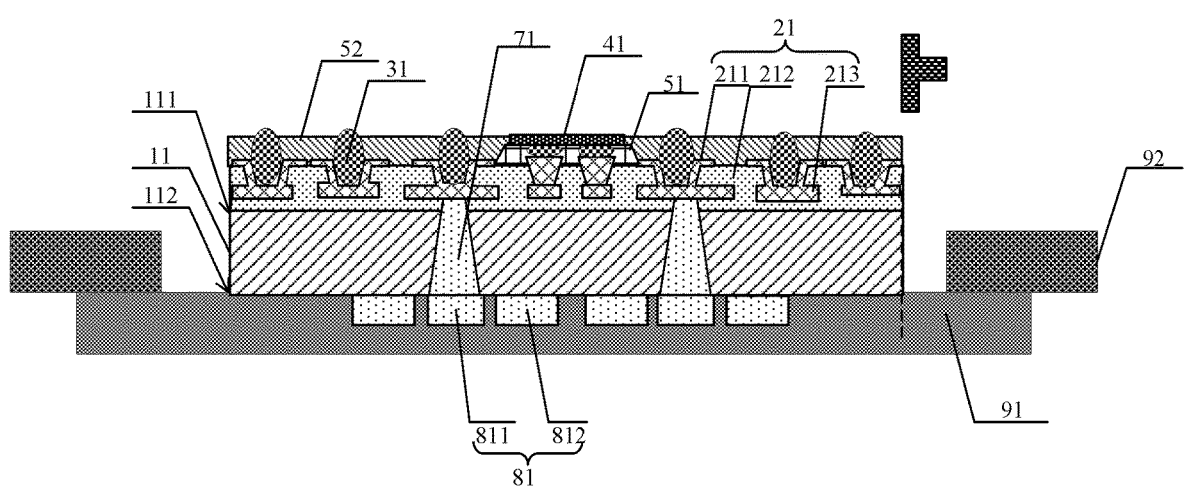
FIG. 11 shows the cross sectional view of the final packaging structure according to the present application.

Additionally, it should be further noted that, this application further provides a method for fabricating the foregoing semiconductor packaging structure with an antenna assembly. FIG. 1 shows a provided substrate 11. FIG. 2 shows a structure after a rewiring layer 21 (top side RDL) is fabricated. Then, as shown in FIG. 3, a metal bump 31 (ball mount) is fabricated. Then, a process of bonding a semiconductor chip 41 (die bonder) shown in FIG. 4 is performed. Then, a bottom filling layer 51 (dispenser) is formed, as shown in FIG. 5. Then, a polymer layer 52 (molding) is formed, as shown in FIG. 6. Then, a via hole 61 (backside laser drill) is fabricated, as shown in FIG. 7. Then, a conductive column 71 (metal glue printer) is formed by means of deposition, as shown in FIG. 8. Then, an antenna assembly (antenna layer) is fabricated, as shown in FIG. 9 and FIG. 10. As shown in FIG. 11, the method further includes a step of performing wafer sawing (wafer mount & dicing saw or laser saw), in a sawing process, a bonding layer 91 and a fixed ring 92 are further included, thereby obtaining the semiconductor packaging structure of the present application.

To sum up, in the present application, the semiconductor packaging structure with an antenna assembly includes: a substrate, having a first surface and a second surface opposite to the first surface, at least one via hole running through the first surface and the second surface is formed in the substrate; a rewiring layer, located on the first surface of the substrate; a metal bump, located on a side of the rewiring layer and electrically connected to the rewiring layer; a semiconductor chip, located on a surface of the rewiring layer and electrically connected to the rewiring layer, a space is configured between the semiconductor chip and the metal bump; a conductive column, filling in the via hole, and running through the substrate vertically; a bottom filling layer, filling up a gap between the semiconductor chip and the rewiring layer; a polymer layer, located on a surface of the rewiring layer, surrounding the metal bump, the bottom filling layer and the semiconductor chip, and exposing a part of the metal bump and a part of the semiconductor chip; and an antenna assembly, located on the second surface of the substrate, the antenna assembly is electrically connected to the metal bump sequentially through the conductive column and the rewiring layer. By using the foregoing solution, in the semiconductor packaging structure provided in the present application, the polymer layer is properly designed to cooperate with structures such as the bottom filling layer, to increase a bonding strength between the metal bump and the rewiring layer and a bonding strength between the semiconductor chip and the bottom filling layer, further prevent damage from water vapor and the like, and effectively improve stability of the packaging structure and further raise the product yield. By disposing the antenna assembly and the rewiring layer on two opposite surfaces of the substrate, and based on characteristic design of an electrical connection between the antenna assembly and the semiconductor chip by using the conductive column in the substrate, the rewiring layer and the metal bump, the semiconductor structure with an antenna assembly of the present application may therefore facilitate proper packaging layout design. In the present application, quartz glass or the like is selected as the substrate, which has good heat conductivity better than that of a packaging material by nearly ten times to hundred times, thus resolving the heat effect problem. Moreover, because a quartz plate has no warpage problem, it is further ensured that in a subsequent process, the chip will not warp and break easily. Furthermore, manufacturing is made easier, and its yield is improved so the cost is decreased. The structure of the present application is compact and suitable for mass production. Therefore, the disclosed structure has a high industrial utilization value.

The above-mentioned embodiments are only used for exemplarily describing the principle and effects of the present application instead of limiting the present application. One skilled in the art may make modifications or changes to the above-mentioned embodiments without departing from the spirit and scope of the present application. Therefore, all equivalent modifications or changes made by those who have common knowledge in the art without departing from the spirit and technical thought disclosed by the present application shall be still covered by the claims of the present application.

What is claimed is:

1. A semiconductor packaging structure with an antenna assembly, comprising:
    a substrate having a first surface and a second surface opposite to the first surface, wherein at least one via hole through the first surface and the second surface is formed in the substrate;
    a rewiring layer located on the first surface of the substrate;
    a plurality of metal bumps, located on a surface of the rewiring layer and electrically connected to the rewiring layer;
    a semiconductor chip having contacting ports, located on the surface of the rewiring layer and electrically connected to the rewiring layer through the contacting ports, wherein a space is configured between the semiconductor chip and each of the plurality of metal bumps;
    a conductive column, filling in the at least one via hole;
    a bottom filling layer, filling up a gap between the semiconductor chip and the rewiring layer;
    a polymer layer, located on the surface of the rewiring layer, surrounding the plurality of metal bumps, the bottom filling layer and the semiconductor chip, but exposing a top part of each of the plurality of metal bumps and a top part of the semiconductor chip, wherein the bottom filling layer comprises materials different from a material of the polymer layer; and
    an antenna assembly, located on the second surface of the substrate, wherein the antenna assembly is electrically connected to at least one of the plurality of metal bumps through the conductive column and the rewiring layer.

2. The semiconductor packaging structure with an antenna assembly as in claim 1, wherein the polymer layer comprises any one of a polyimide layer, a silica gel layer and an epoxy resin layer.

3. The semiconductor packaging structure with an antenna assembly as in claim 1, wherein the substrate comprises a quartz glass substrate or a sapphire substrate.

4. The semiconductor packaging structure with an antenna assembly as in claim 1, wherein the rewiring layer comprises:
    a dielectric layer, bonded onto the first surface of the substrate;
    a metal wire layer, located inside the dielectric layer; and
    an under-bump metal layer, patterned on a surface of the dielectric layer, and electrically connected to the metal wire layer, wherein the plurality of metal bumps is disposed on the under-bump metal layer.

5. The semiconductor packaging structure with an antenna assembly as in claim 1, wherein a structure of each of the plurality of metal bumps comprises: a copper column, a nickel layer located on a top surface of the copper column and a solder bump located on the nickel layer.

6. The semiconductor packaging structure with an antenna assembly as in claim 1, wherein the antenna assembly comprises a plurality of antenna units each having a same shape, and disposed with a space from each other.

7. The semiconductor packaging structure with an antenna assembly as in claim 6, wherein the plurality of antenna units each comprises a central portion and a peripheral portion around the central portion, wherein a space is configured between the peripheral portion and the central portion, and wherein the central portion is electrically connected to one of the plurality of metal bumps through the conductive column and the rewiring layer.

8. The semiconductor packaging structure with an antenna assembly as in claim 7, wherein an outer circumvent of the central portion is a circle, wherein an outer circumvent of the peripheral portion is a square, and an inner circumvent of the peripheral portion is a circle.

9. The semiconductor packaging structure with an antenna assembly as in claim 6, wherein the plurality of antenna units is arranged on the second surface of the substrate in an array, or in a loop.

10. The semiconductor packaging structure having the antenna module as in claim 6, wherein the plurality of antenna units is arranged irregularly on the second surface of the substrate.

11. The semiconductor packaging structure with an antenna assembly as in claim 6, wherein the antenna assembly further comprises at least two layers of antenna assembly units, and each layer of the at least two layers of antenna assembly units comprises at least one of the plurality of antenna units.

12. The semiconductor packaging structure with an antenna assembly as in claim 1, wherein the via hole is made by laser drilling.

13. The semiconductor packaging structure with an antenna assembly as in claim 1, wherein a material of the bottom filling layer comprises adhesives.

* * * * *